United States Patent
Casper et al.

(10) Patent No.: US 7,275,004 B2
(45) Date of Patent: Sep. 25, 2007

(54) METHOD AND APPARATUS TO PERFORM ON-DIE WAVEFORM CAPTURE

(75) Inventors: Bryan K. Casper, Hillsboro, OR (US); Aaron K. Martin, Hillsboro, OR (US); James E. Jaussi, Hillsboro, OR (US); Stephen R. Mooney, Beaverton, OR (US); Ganesh Balamurugan, Urbana, OR (US)

(73) Assignee: Intel Corporation, Santa Clara, CA (US)

( * ) Notice: Subject to any disclaimer, the term of this patent is extended or adjusted under 35 U.S.C. 154(b) by 276 days.

(21) Appl. No.: 10/743,349

(22) Filed: Dec. 23, 2003

(65) Prior Publication Data

US 2005/0134369 A1    Jun. 23, 2005

(51) Int. Cl.
*G06F 19/00* (2006.01)
(52) U.S. Cl. ............................ 702/66; 702/70; 702/124
(58) Field of Classification Search .................. 702/66, 702/67, 70, 117, 120
See application file for complete search history.

(56) References Cited

U.S. PATENT DOCUMENTS

| | | | |
|---|---|---|---|
| 5,373,257 A | * 12/1994 | Shimoda | 331/8 |
| 5,648,735 A | * 7/1997 | Bowers et al. | 327/65 |
| 6,411,242 B1 | * 6/2002 | Oprescu et al. | 341/155 |
| 6,563,373 B1 | * 5/2003 | Shou et al. | 327/554 |
| 6,614,296 B2 | 9/2003 | Casper | 330/9 |
| 6,617,918 B2 | 9/2003 | Casper | 330/9 |
| 6,621,323 B1 | 9/2003 | Casper et al. | 327/379 |
| 6,621,330 B1 | 9/2003 | Jaussi et al. | 327/552 |
| 6,624,688 B2 | 9/2003 | Jaussi et al. | 327/552 |
| 6,675,071 B1 | * 1/2004 | Griffin et al. | 700/286 |
| 6,741,953 B2 | * 5/2004 | Hernandez et al. | 702/187 |
| 2003/0001667 A1 | 1/2003 | Casper et al. | 330/9 |
| 2003/0128067 A1 | 7/2003 | Jaussi et al. | 327/552 |
| 2003/0184338 A1 | 10/2003 | Comer et al. | 326/37 |

* cited by examiner

*Primary Examiner*—Bryan Bui
*Assistant Examiner*—Jonathan Moffat
(74) *Attorney, Agent, or Firm*—Ked & Associates, LLP

(57) ABSTRACT

An integrated circuit is provided that includes a first port to receive a first signal from a first channel and a first device coupled to the first port to modify a channel response of the first signal received from the first channel. A waveform capture device may be coupled to the first device to capture a waveform of a signal modified by the first device.

31 Claims, 8 Drawing Sheets

METHOD AND APPARATUS TO PERFORM ON-DIE WAVEFORM CAPTURE

FIELD

Embodiments of the present invention may relate to testing of circuits. More particularly, embodiments of the present invention may relate to the capture of waveforms on a die or chip.

BACKGROUND

Within electronic systems, integrated circuits may communicate with each other using electrical signals that travel through electrical conductors. During testing of electronic systems, the electrical conductors may be probed with test equipment to verify that electrical signals exhibit desired characteristics. For example, signal characteristics such as voltage amplitude and time delay may be measured using test equipment.

Test equipment probes may have an effect on electrical signals when conductors are probed. For example, capacitive effects of a probe may distort a signal when the probe is placed upon an electrical conductor through which the signal travels. This can result in measurement errors in part because the signal is being distorted by the test equipment.

As the size of electronic systems decrease, and as the speeds with which they operate increases, the signal distorting effects of test equipment can become more pronounced.

BRIEF DESCRIPTION OF THE DRAWINGS

The foregoing and a better understanding of the present invention will become apparent from the following detailed description of arrangements and example embodiments and the claims when read in connection with the accompanying drawings, all forming a part of the disclosure of this invention. While the foregoing and following written and illustrated disclosure focuses on disclosing arrangements and example embodiments of the invention, it should be clearly understood that the same is by way of illustration and example only and the invention is not limited thereto.

The following represents brief descriptions of the drawings in which like reference numerals represent like elements and wherein.

DETAILED DESCRIPTION

Figure 1:
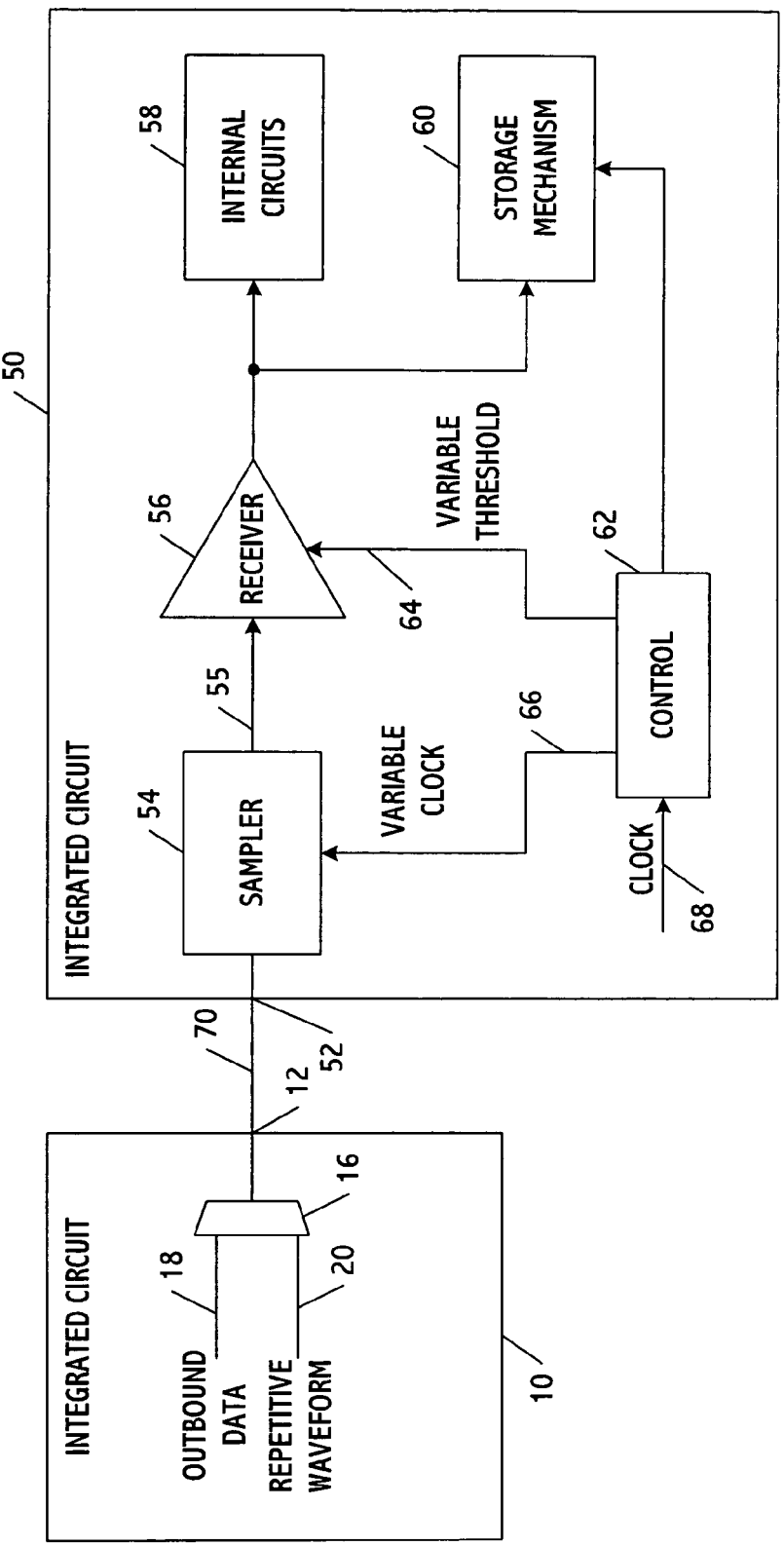
FIG. 1 illustrates two integrated circuits coupled together according to an example arrangement.

In the following detailed description, like reference numerals and characters may be used to designate identical, corresponding or similar components in differing figure drawings. Further, in the detailed description to follow, example sizes/models/values/ranges may be given although the present invention is not limited to the same. Well-known power/ground connections to integrated circuits (ICs) and other components may not be shown within the FIGS. for simplicity of illustration and discussion. Further, arrangements and embodiments may be shown in block diagram form in order to avoid obscuring the invention, and also in view of the fact that specifics with respect to implementation of such block diagram arrangements may be dependent upon the platform within which the present invention is to be implemented. That is, the specifics are well within the purview of one skilled in the art. Where specific details are set forth in order to describe example embodiments of the invention, it should be apparent to one skilled in the art that the invention can be practiced without these specific details.

Embodiments of the present invention may relate to waveform capture on a receiver (or receiving device) that performs signal modification(s) such as filtering. For example, embodiments of the present invention may be applicable to testing of channel performance. Embodiments of the present invention are therefore applicable to reconstructing a channel response in order to perform waveform capturing.

Waveform capturing may be used to perform system level characterization and produce diagrams (i.e., eye diagrams) useful during testing (or measurement) of circuits (such as integrated circuits). Waveform capturing may also be used to perform interconnect characterization by averaging out any source of circuit noise and jitter. Waveform capturing may be used with any device that uses high-speed input/output (I/O).

FIG. 1 illustrates two integrated circuits coupled together according to an example arrangement. Other arrangements are also possible. More specifically, FIG. 1 shows an integrated circuit 10 and an integrated circuit 50 coupled together by a conductor 70. In operation, the integrated circuit 10 may source a waveform on an output node 12. The waveform travels through the conductor 70 and is received by the integrated circuit 50 at an input node 52. The integrated circuit 10 may include a multiplexer 16 to select a data source from either outbound data on a node 18, or a repetitive waveform on a node 20. The outbound data on the node 18 may be sourced by other circuits (not shown) in the integrated circuit 10, and may represent data to be transferred between integrated circuits during normal operation. For example, the multiplexer 16 may select outbound data from a register file, an arithmetic logic unit (ALU), a memory device, or any other functional block within the integrated circuit 10. The repetitive waveform may be selected by the multiplexer 16 to provide a repetitive waveform on the conductor 70 to be captured, in whole or in part, by the integrated circuit 50.

The integrated circuit 50 includes a sampler 54, a receiver 56, internal circuits 58, a storage mechanism 60, and a control mechanism 62. The sampler 54 may sample the waveform received on the input node 52 in response to the variable clock signal sourced by the control mechanism 62. The sampler 54 may provide the waveform sample to the receiver 56 on a node 55. The receiver 56 may compare an amplitude of the waveform sample on the node 55 to a variable threshold on the node 64, and provide a digital output to either or both of the internal circuits 58 or the storage mechanism 60. The internal circuits 58 may represent any circuitry within the integrated circuit 50 that receives data from the receiver 56 during normal operation. For example, the internal circuits 58 may include registers, memory, graphics devices, or any other functional blocks within the integrated circuit 50. The storage mechanism 60 may be used to store information related to "waveform-capture" mode.

The receiver 56 may be one of many different types. For example, the receiver 56 may include an amplifier with a single-ended input to receive the waveform sample on the node 55, and a reference voltage input to receive a reference voltage on the node 64. The receiver 56 may also include a variable offset comparator with a differential input to receive a differential input signal on the node 55. The node 55 may also include two conductors to carry a differential signal. The variable threshold on the node 64 may be a reference voltage to be compared against the waveform sample on the node 55, or may be a control signal that specifies a threshold or reference to be used within the receiver 56. For example, the variable threshold on the node 64 may include a digital word that specifies an offset to be utilized within a variable offset comparator that has a differential input.

The control mechanism 62 may provide a variable clock signal to the sampler 54 on a node 66 and a variable threshold to the receiver 56 on the node 64. The control mechanism 62 may be any type of circuit capable of providing the variable clock and variable threshold, and capable of communicating with the storage mechanism 60. For example, the control mechanism 62 may include a microprocessor, a state machine, or the like. The control mechanism 62 may also include a voltage reference circuit. The control mechanism 120 may also include a memory-mapped interface to allow an external device to access the capabilities of the control mechanism 62.

Each of the integrated circuits 10 and 50 may operate in one of two modes: an "operational" mode, and a "waveform-capture" mode. In the operational mode, the integrated circuit 10 may source data onto the conductor 70 from the outbound data node 12. This data, as described above, may be from any source within the integrated circuit 10. Also in the operational mode, the sampler 54 may sample the signal waveform on the conductor 70 at the appropriate time and present the waveform sample to the receiver 56. The receiver 56 may convert the waveform sample to digital data, and the digital data may be sent on to the internal circuits 58.

In the operational mode, the control mechanism 62 may source a clock signal that allows the sampler 54 to sample the incoming waveform at a time point that provides an adequate timing margin. For example, for a four gigabit per second (4 Gb/s) data link, the sampler 54 may sample every 250 picoseconds (ps) near the center of each bit cell. Also in the operational mode, the control mechanism 62 may source a threshold value to the receiver 56 that provides adequate timing margin. The control mechanism 62 may use information gathered in the waveform-capture mode (described below) to determine the appropriate threshold value for operational mode.

The operational mode may be used when the integrated circuits 10 and 50 are performing normal functions as part of an electronic system. For example, the integrated circuit 10 may be a microprocessor, and the integrated circuit 50 may be a peripheral device coupled to the microprocessor, where both are part of a computer system. The operational mode may be used when the computer is operating normally, and the integrated circuit 10 is transmitting data to the integrated circuit 50 as part of normal computer operation.

In the waveform-capture mode, the integrated circuit 10 may provide a repetitive waveform on the conductor 70, and the integrated circuit 50 may repeatedly sample the waveform at various times and compare the sampled waveform to various thresholds to "capture" the waveform. The repetitive data provided by the integrated circuit 10 can be any repeating data stream, such that the integrated circuit 50 can sample the "same" time point of the waveform relative to a fixed point in the repeating pattern. For example, the repetitive data may be produced by a linear feedback shift register (LFSR), a state machine, a shift register preloaded with data of interest, or the like.

In at least one example arrangement, a first-in-first-out (FIFO) register may be configured to produce a repetitive pattern every 80 bits. In another example arrangement, shorter or longer patterns may be used. During the waveform-capture mode, the waveform that is captured may correspond to a portion of the repeating waveform, or the entire repeating waveform.

The control mechanism 62 may provide the variable clock to the sampler 54 on the node 66 to allow the sampler 54 to vary the time at which a waveform sample is taken. In some arrangements, the variable clock may be varied over at least one bit cell period. For example, for a four gigabit per second (4 Gb/s) data link, the variable clock may be varied over at least 250 picoseconds (ps). In some arrangements, the variable clock signal can be varied with approximately 9 ps resolution.

The control mechanism 62 may also provide the variable threshold to the receiver 56 on the node 64. The receiver 56 may produce a digital signal that is the result of an amplitude comparison between the sampled waveform on the node 55 and the variable threshold on the node 64. Accordingly, the variable threshold causes the receiver 56 to change the received signal level below which a digital "0" is output, and above which a digital "1" is output.

By varying the variable clock and the variable threshold in a coordinated fashion, the control mechanism 62 may cause the "capture" of all or part of the repetitive waveform received on the input node 52. For each time point in a repetitive waveform, the control mechanism 62 may vary the threshold to take multiple measurements of the same point in the repeating waveform.

Figure 2:
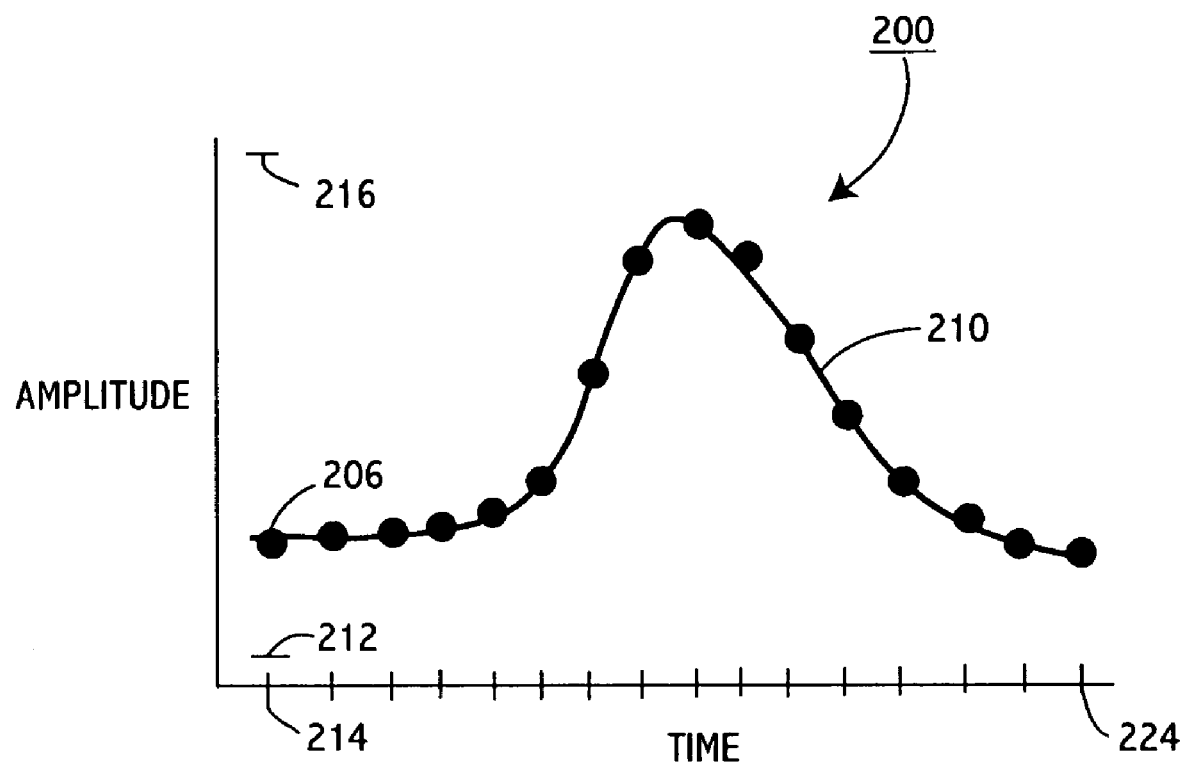
FIG. 2 shows a captured waveform according to an example arrangement.

FIG. 2 shows a captured waveform 200 according to one arrangement. Other arrangements are also possible. In the graph of FIG. 2, the vertical axis represents amplitude and the horizontal axis represents time. The waveform 200 corresponds to a portion of a repeating waveform. For example, the waveform 200 may correspond to a 135 ps section of a repeating waveform on the conductor 70 (FIG. 1) sampled at 9 ps intervals. The waveform 200 may be captured and stored within the storage mechanism 60.

Figure 3:
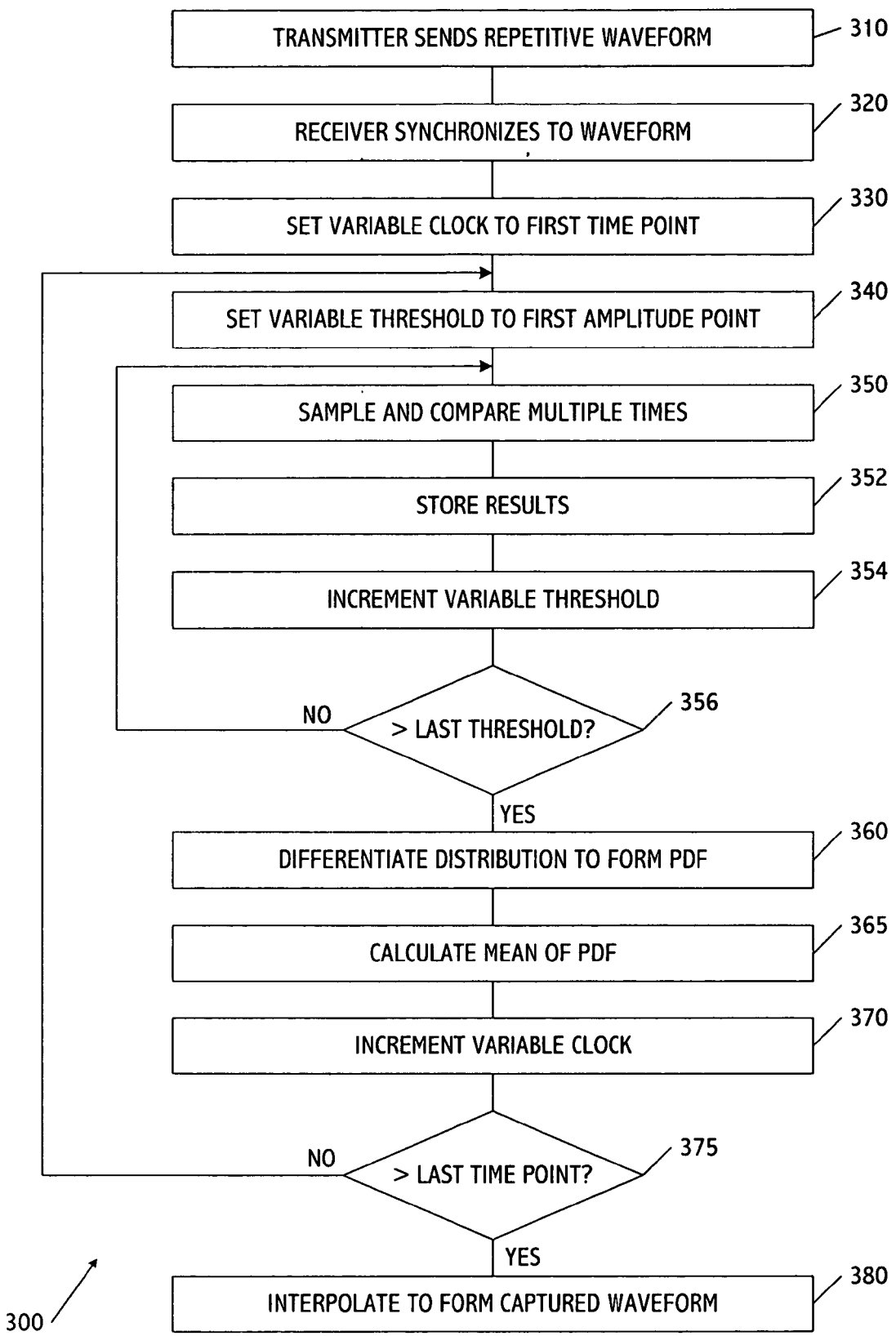
FIG. 3 is a flowchart showing a waveform capturing methodology according to an example arrangement.

FIG. 3 is a flowchart showing a waveform capturing methodology according to an example arrangement. Other operations, orders of operations and arrangements are also possible. FIG. 3 will be described with respect to elements of FIG. 1 and the graph and waveform shown in FIG. 2.

In block 310, a transmitter may send a periodic and repeatable waveform to a receiver. This may correspond to the integrated circuit 10 sending a repetitive waveform on the conductor 70 to the integrated circuit 70 (FIG. 1). In block 320, the receiver synchronizes to the repeating waveform such that time points within the waveform can be repeatedly sampled. This may correspond to the control mechanism 62 receiving the clock signal on a node 68 (FIG.

1). This may also correspond to a clock recovery loop circuit (not shown) to generate a clock signal.

In block 330, the variable clock may be set to sample the repetitive waveform at the first time point of interest. This time point may correspond to a time 214 (FIG. 2). In block 340, the variable threshold may be set to a first value corresponding to an amplitude 212 shown in FIG. 2. In block 350, the repeating waveform may be sampled a number of times at the current time point, and the waveform sample may be compared against the current threshold to produce a digital "0" or a digital "1". In block 352, the number of digital "1"s or the number of digital "0"s output by the receiver 56 may be stored in the storage mechanism 60.

In block 354, the threshold may be incremented, and the actions in blocks 350 and 352 may be repeated for the new threshold. Block 356 tests the threshold level, and blocks 350, 352, and 354 may be repeated until the threshold has been incremented to the last point of interest, shown in FIG. 2 as an amplitude 216.

When the threshold is initialized at a low amplitude, it is more likely that the receiver 56 will output a digital "1" than a digital "0" because the amplitude of the waveform is clearly above the threshold. Likewise, when the threshold is at a high amplitude, it is more likely that the receiver 56 will output a digital "0" than a digital "1" because the amplitude of the waveform is clearly below the threshold. As the threshold is increased towards the amplitude of the waveform from below, the likelihood increases that the receiver 56 will output a digital "0" rather than a digital "1". This information is stored as a "distribution" in the storage mechanism 60 after the operations in blocks 340, 350, 352, and 354 are performed for a given time point.

In block 360, the distribution stored in the storage mechanism 60 may be differentiated to create a probability density function (pdf) of the uncertainty in the waveform. This uncertainty can be caused by many different factors, including but not limited to, jitter, voltage noise, or noise present in the receiver 56.

In block 365, the mean of the pdf for each time point is calculated to determine the most likely amplitude position of the waveform at each time point. The mean of the pdf for the first time point 214 is shown at point 206.

In block 370, the variable clock may be incremented, and the actions in blocks 350 and 352 are repeated for the new threshold. Block 375 tests the time point, and blocks 340, 350, 352, 354, 356, 360, 365, and 370 are repeated until the clock has been incremented to the last time point of interest, shown in FIG. 2, as a time point 224. This corresponds to sampling the waveform multiple times for each threshold at each time point shown in FIG. 2, storing the likelihood information for each threshold, creating the pdf for the time point, and calculating the mean of the pdf.

The captured waveform may then be reconstructed in block 380 by interpolating between the means at each time point. In FIG. 2, the captured waveform is shown as curve 210.

Waveform capturing will now be described with respect to filtering performed on the receiver side of a transmission line. These techniques may occur within an integrated circuit such as the integrated circuit 70 shown in FIG. 1. While the discussion relates to filtering techniques, other types of signal processing events are also applicable. A brief discussion will be provided of filtering techniques followed by a discussion of the applicability of waveform capturing to embodiments/arrangements that include these (and/or other) filtering techniques.

Every transmission line (such as the conductor 70 shown in FIG. 1) has a finite bandwidth, and for signal bandwidths that are comparable to or exceed the transmission line (channel) bandwidth, intersymbol interference (ISI) may present a problem. Furthermore, actual transmission lines may have dispersion, whereby different spectral portions of a signal travel at different speeds. This may result in pulse spreading, again leading to intersymbol interference. As an example, for high data rates such as 10 Gbs (Giga bits per second), the transmission lines may have intersymbol interference. Channel equalization is a method in which a filter is employed at a receiver so as to equalize the channel.

Additionally, digital signals may have relatively sharp square waveforms representing two or more logic levels. However, line capacitance, noise and the like can cause attenuation of the digital signals and a corresponding "rounding" of the sharp transitions between logic levels. Accordingly, upon receipt of a digital signal, the signals may be restored to their original shape by de-attenuating the signal. Similarly, analog signals are often attenuated during transmission. In a variety of applications, analog signals may be restored to their pre-transmission waveforms prior to further signal processing.

Finite impulse response (FIR) filters may be widely used for various applications. One application is a discrete linear equalizer (DLE), which is used to de-attenuate digital and analog signals in communication systems and integrated circuits. Linear equalizers may be used to restore a signal by taking N samples of the signal over a discrete time window, multiplying each successive input sample $X_i$ by a weighting coefficient $A_i$, and outputting the sum of the products. The successive data outputs of an FIR filter may be calculated as:

$$Y_1 = \sum_{i=1}^{N} A_i X_i$$

$$Y_2 = \sum_{i=1}^{N} A_i X_{i+1}$$

$$Y_3 = \sum_{i=1}^{N} A_i X_{i+2}$$

and so on. The variable N accordingly may define the number of "stages" in the FIR filter. When N=3, an FIR filter weighs the current signal against two previously received signals and outputs a weighted average digital signal. Optionally, successive samples can be included in the weighted average.

The analog signal filtering accomplished by such weighted averaging can be readily appreciated by considering a 5V analog source signal that includes data points 0V, 0V, 0V, 5V. During transmission, the analog signal attenuates and becomes, in a simplified example, 0V, 0V, 2.5V, 5V. A three stage FIR filter, upon receiving the 2.5V data point, can combine that data point with the weighted products of the two previously received data points. The FIR output may be less than 2.5V by a factor dictated by the weighting constants, and the attenuation of the signal will be thereby counteracted. By appropriate selection of the weighting constants $A_i$ and appropriate post-filtration amplification, the attenuated signal can be restored to its original waveform, or 0V, 0V, 0V, 5V.

Embodiments of the present invention will now be described with respect to waveform capturing when a channel response is modified such as by filtering as discussed above.

Figure 4:
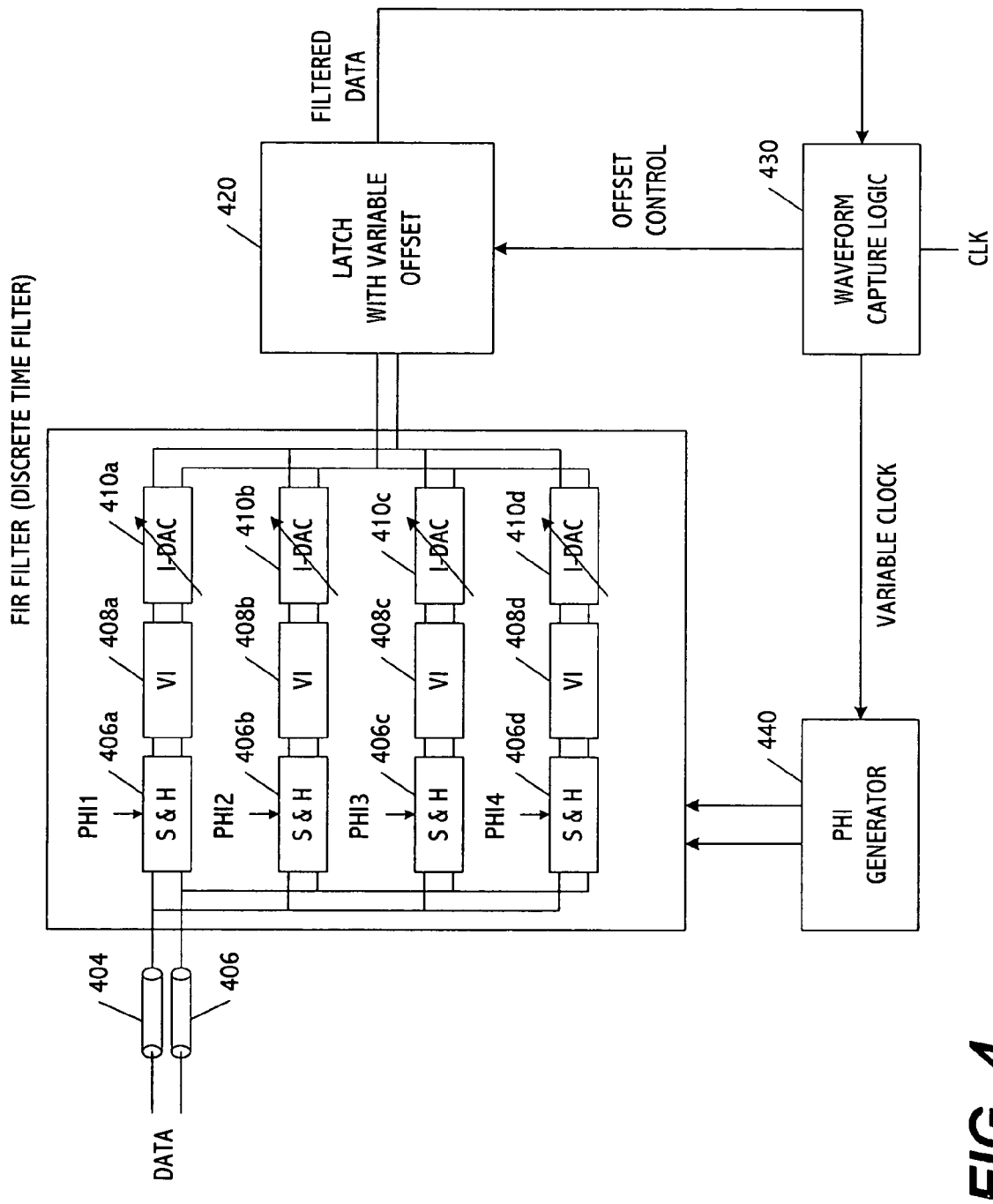
FIG. 4 shows an I/O receiver having a filtering and waveform capturing methodology for one channel according to an example embodiment of the present invention.

FIG. 4 shows an I/O receiver having a filtering and waveform capturing methodology for one channel according to an example embodiment of the present invention. Other embodiments and configurations are also within the scope of the present invention. This I/O receiver may be an integrated circuit such as described above as well as including additional circuitry to be described below. More specifically, FIG. 4 shows that input ports 404 and 406 may receive an input differential voltage from a transmission line, such as the conductor 70 shown in FIG. 1. Features of the filtering and waveform capturing (such as sample-and-hold circuits 406a-406d, voltage-to-current (V-I) converters 408a-408d, current multipliers (I-DAC) 410a-410d, a comparator/latch device 420 and waveform capture logic (430) may all be provided on-die, such as on the integrated circuit 70 shown in FIG. 1. While FIG. 4 only shows one transmission line (or channel) input to the I/O receiver, a system having more than one channel would have numerous I/O receivers capable of performing the operations to be described with respect to FIG. 4. That is, each channel of a system may include similar corresponding filtering components. Each of these separate channels may share a similar comparator/latch device 420 and similar waveform capture logic 430, and/or each channel may include its own comparator/latch device and waveform capture logic.

The sample-and-hold (S&H) circuits 406a-406d may sample and hold the received differential signal received over the channel. Each of the S&H circuits 406a-406d may generally correspond to the sampler 54 shown in FIG. 1. As an example, each S&H circuit 406a-406d may include two switches (e.g., pass gates), each connected to a capacitor, for example, to store the received differential voltage. Other types of S&H circuits are also within the scope of the present invention. A clock phase generator 440 may provide clock signals at various phases for each of the S&H circuits 406a-406d. For example, the various clock signals are shown as phase signals Phi1-Phi4 input to the S&H circuits 406a-406d, respectively. Each S&H circuit 406a-406d may be coupled to one of the V-I converters 408a-408d. Each of the V-I converters 408a-408d may be coupled to a respective one of the current multipliers 410a-410d. Each of the current multipliers 410a-410d may be associated with a set of control voltages to perform suitable weighting (i.e., current multiplication). That is, a set of control voltages may be applied to each of the current multipliers 410a-410d.

Each of the current multipliers 410a-410d may be coupled to the comparator/latch device 420. The comparator/latch device 420 may sum together the outputs of the current multipliers 410a-410d. The comparator/latch device 420 may include an offset mechanism by which to skew a reference current so as to skew the effective voltage within a time slice. In this example, the current may be offset since multiple samples are provided from the current multipliers 410a-410d.

The waveform output from the comparator/latch device 420 may be input to the waveform capture logic (similar to the storage mechanism 140 shown in FIG. 1). The waveform capture logic 430 may perform waveform capturing in a similar manner as discussed above with respect to FIG. 3.

Embodiments of the present invention are applicable to sampling occurring prior to filtering operations. Embodiments of the present invention are also applicable to filtering operations occurring before sampling of the signals. For example, a continuous time filter may be provided before sampling circuits (e.g. sample and hold circuits). A continuous time filter may include an amplifier with feedback to equalize the signals on the channel.

Figure 5:
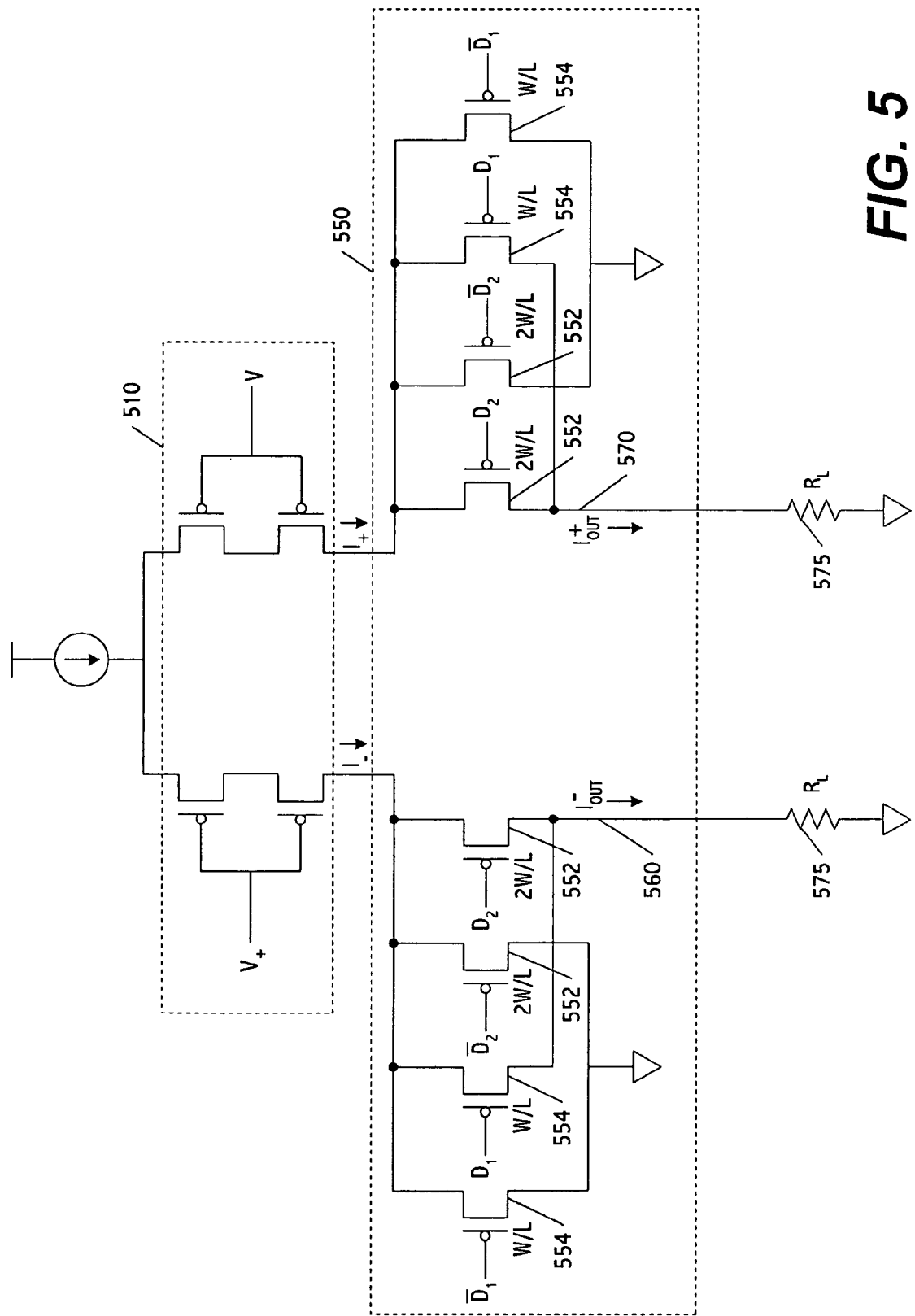
FIG. 5 is a circuit diagram of a V-I converter and current multiplier according to an example arrangement.
Figure 6:
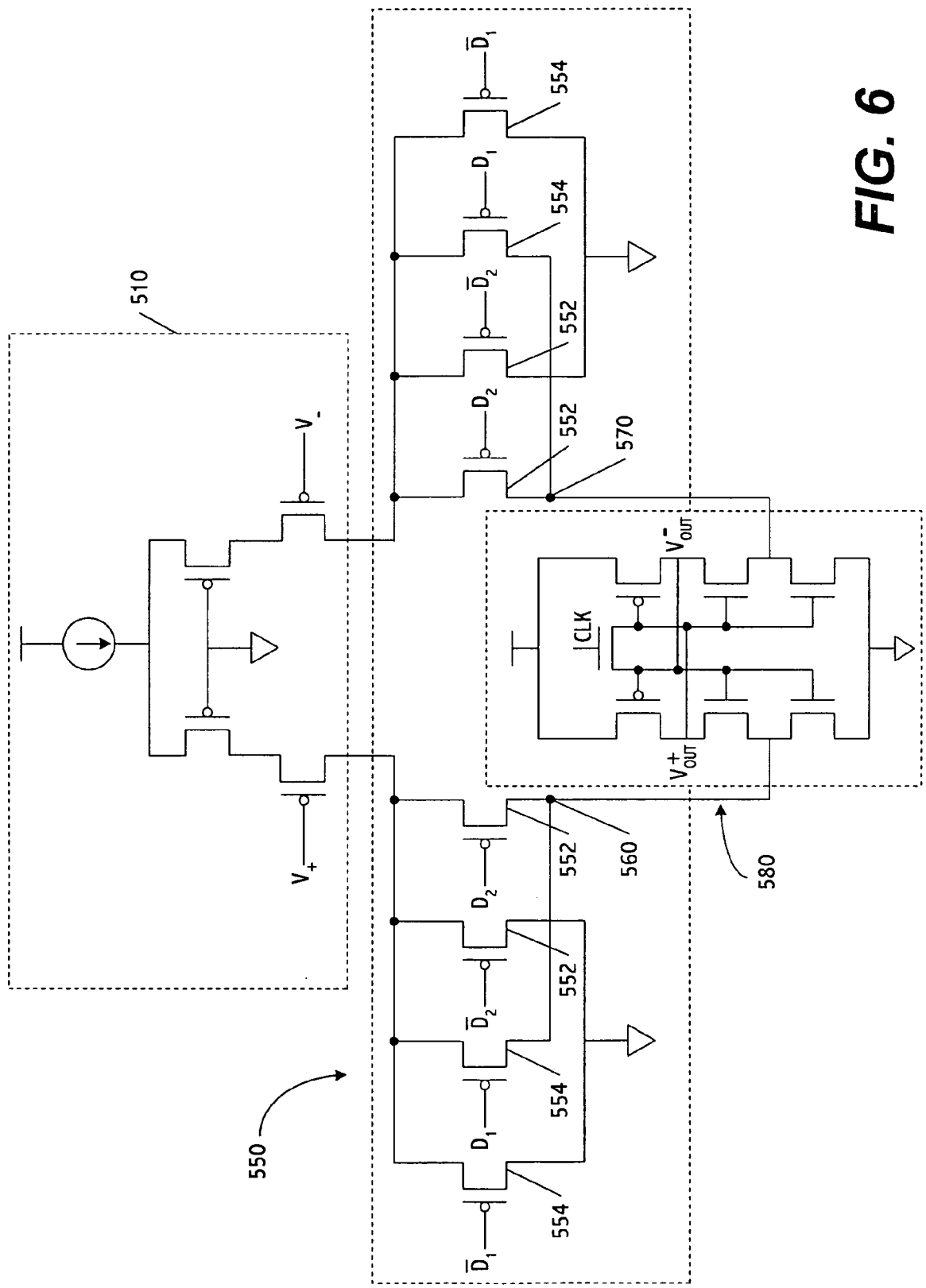
FIG. 6 is a circuit diagram of a V-I converter, current multiplier and latch device according to an example embodiment of the present invention.

FIG. 5 is a circuit diagram of a V-I converter and a current multiplier according to an example arrangement. Other arrangements are also possible. FIG. 6 is a circuit diagram of a V-I converter, a current multiplier and a current latch according to an example embodiment of the present invention. Other embodiments are also within the scope of the present invention. For simplicity, only a 2-bit current multiplier is shown although a current multiplier for a different number of bits may also be implemented.

More specifically, FIG. 5 shows a V-I converter 510 coupled to a current multiplier 550. The current multiplier 550 may be considered as a digital-to-analog converter because the currents $I^-_{OUT}$ and $I^+_{OUT}$ at output nodes 560 and 570, respectively, are analog signals modulated by control signals $D_1$, $\overline{D}_1$, $D_2$ and $\overline{D}_2$ applied to gates of pMOSFETs 552 and 554 in the current multiplier 550.

In FIG. 5, the current multiplier 550 shunts to ground varying amounts of current depending upon the control signals $D_1$ and $D_2$. In the particular example shown in FIG. 5, the pMOSFETs 552 may have a channel width-to-length ratio twice that of the pMOSFETs 554. When $D_1$ and $D_2$ are both HIGH, then current from the V-I converter 510 is shunted to ground, and the multiplication value is zero. When $D_1$ is LOW and $D_2$ is HIGH, then currents at the nodes 560 and 570 receive ⅓ of the current from the V-I converter 510, and the effective multiplication value is one. When $D_1$ is HIGH and $D_2$ is LOW, then ⅔ of the currents from the V-I converter 510 is passed through to the nodes 560 and 570, and the effective multiplication value is two. Finally, when both $D_1$ and $D_2$ are LOW, then all of the current from the V-I converter 510 is passed through the current multiplier 550, and the effective multiplication is three. This may realize 2-bit multiplication.

The difference in voltages at nodes 560 and 570 represent the multiplication, where the currents are fed into resistive loads 575. In practice, the loads 575 may be realized by active devices. If the voltage at the node 560 subtracted from the voltage at the node 570 represents a weight, then a weight having an opposite sign may be realized by subtracting the voltage at the node 570 from the voltage at the node 560. The channel width-to-length ratios for the pMOSFETs used in the current multiplier 550 need not be powers of two. That is, multiplication may be performed in binary arithmetic. More generally, a mapping may be provided between control signals and currents passed through the current multiplier, and it is not necessary that this mapping represent any particular arithmetic.

The FIG. 5 combination of the V-I converter 50 and current multiplier 550 realizes a weighting of the input differential voltage to the V-I converter. This combination of the V-I converter 510 and the current multiplier 550 along with loads 575 may be realized as a single stage. Utilizing a single stage may help in filtering high data rate signals. A plurality of such combinations may be employed to realize a FIR (Finite Impulse Response) filter.

FIG. 6 is a circuit diagram of a V-I converter, an I-DAC and a current latch according to an example embodiment of the present invention. Other embodiments and configurations are also within the scope of the present invention. More specifically, the V-I converter 510 may correspond to one of the V-I converters 408a-408d shown in FIG. 4. The current multiplier 550 may correspond to one of the I-DACs 410a-410d shown in FIG. 4. Additionally, the current latch 580 may correspond to the comparator/latch device 420 shown in FIG. 4. Operations of the V-I converter 510 and the I-DAC 550 may be similar as described above with respect to FIG. 5 and thus a discussion of the elements will not be provided again. The current latch 580 receives the signals from output nodes 560 and 570 of the various I-DACs 550. Each of the other I-DACs may be similarly coupled to a respective current latch circuit.

Figure 7:
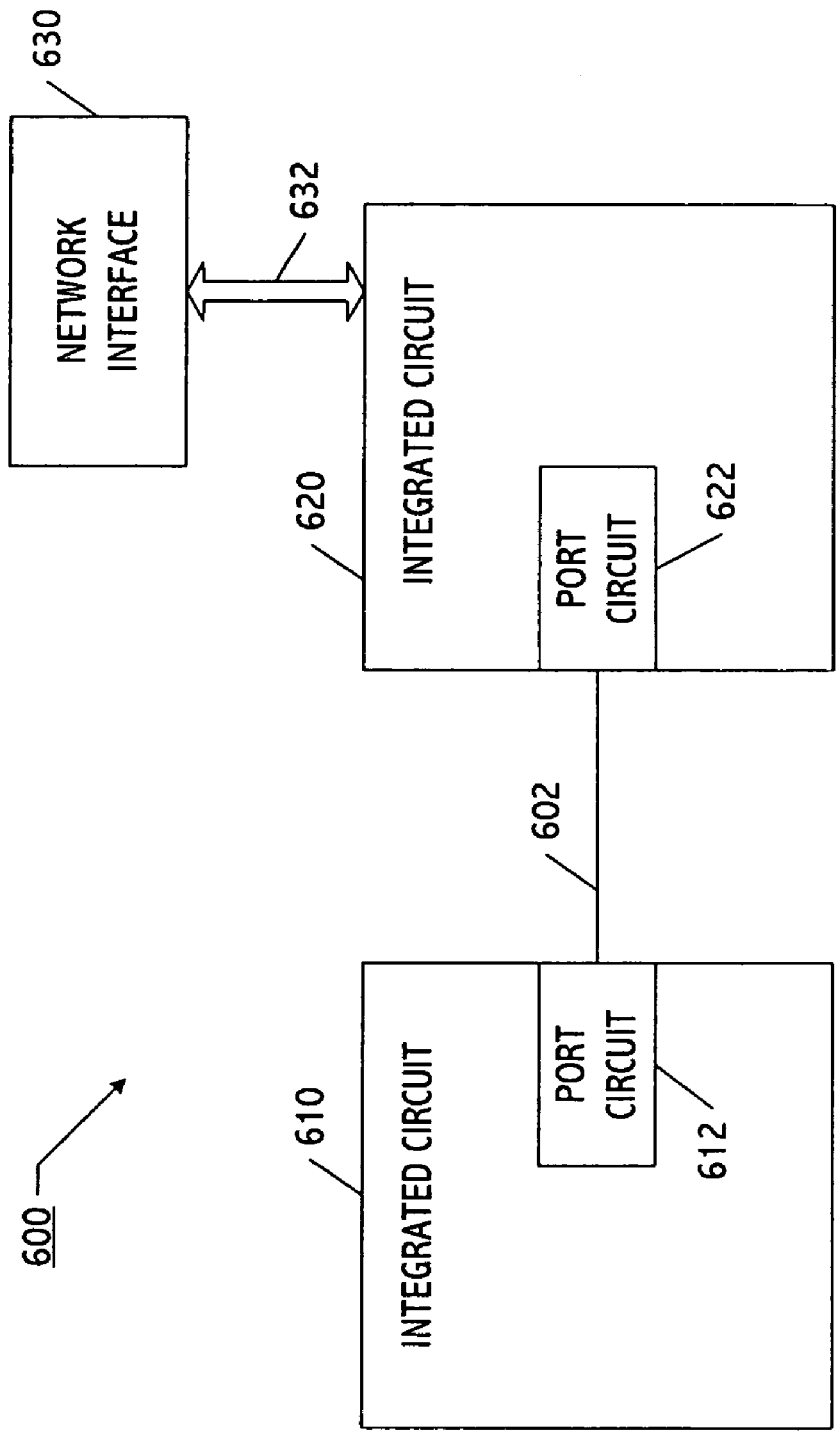
FIG. 7 is a system level block diagram according to an example embodiment of the present invention.
Figure 8:
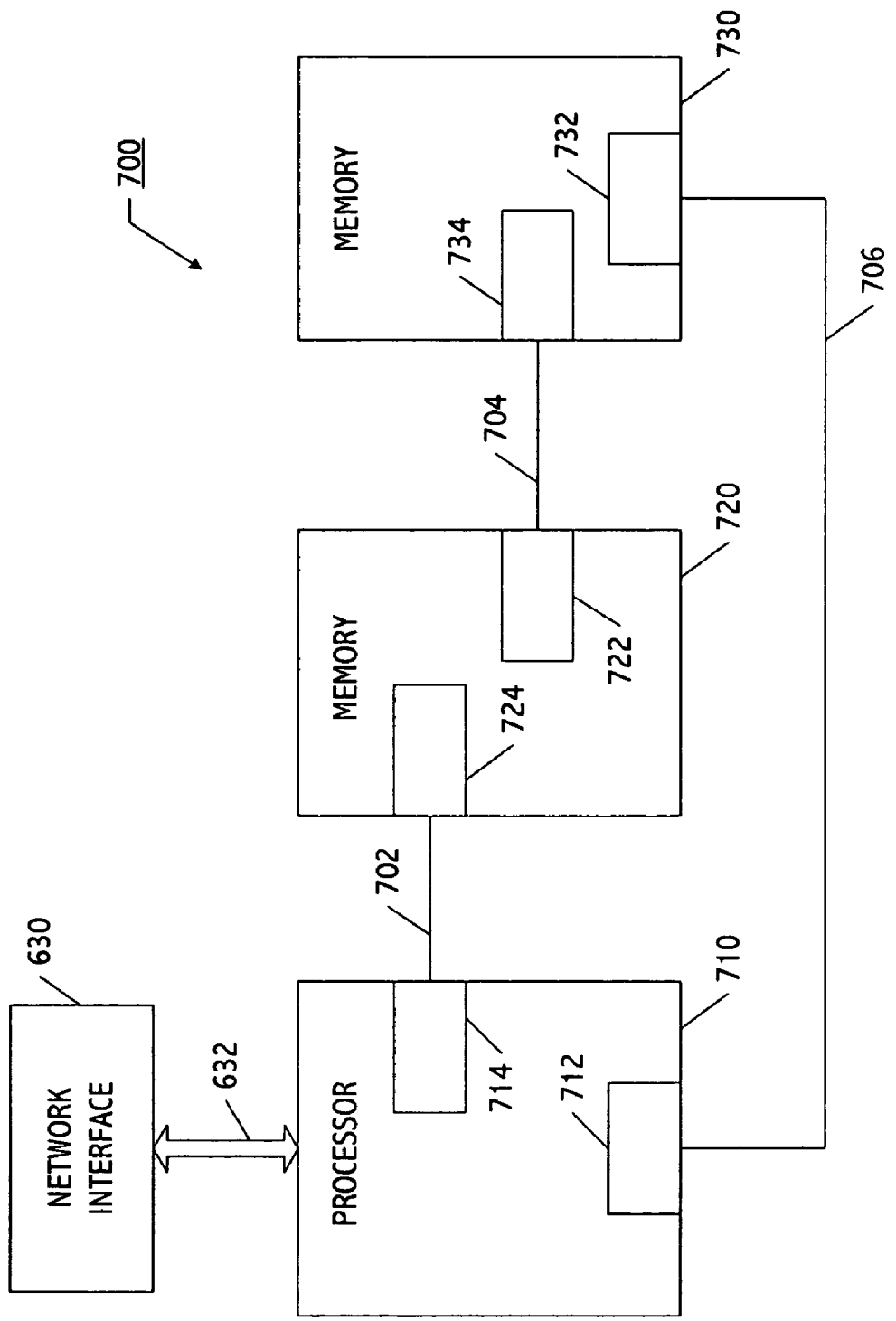
FIG. 8 is a system level block diagram according to an example embodiment of the present invention.

FIGS. 7 and 8 are system level block diagrams according to example embodiments of the present invention. Other embodiments and configurations are also within the scope of the present invention. More specifically, FIG. 7 shows a system 600 including integrated circuits 610 and 620, and a network interface 630. The integrated circuit 610 includes a port circuit 612, and the integrated circuit 620 includes a port circuit 622. Each of the port circuits 612 and 622 may include components to perform filtering and waveform capturing similar as discussed above, such as the components shown and discussed above with respect to FIG. 4. As shown in FIG. 7, the port circuits 612 and 622 communicate across a channel 602 (or transmission line). The port circuits 612 and 622 may be simultaneous bidirectional data (SBD) port circuits that drive data onto, and receive data from, the channel 602. The channel 602 may include one or more physical conductors.

The integrated circuits 610 and 620 can be any type of integrated circuit capable of including one or more port circuits as shown. For example, either of the integrated circuits 610 or 620 can be a processor such as a microprocessor, a digital signal processor, a microcontroller, or the like. Either integrated circuit can also be an integrated circuit other than a processor such as an application-specific integrated circuit (ASIC), a communications device, a memory controller, or a memory such as a dynamic random access memory (DRAM). For ease of illustration, portions of the integrated circuits 810 and 820 are not shown. The integrated circuits may include more circuitry than illustrated in FIG. 7 without departing from the scope of the present invention.

The network interface 630 may communicate with the integrated circuit 620 over a bus 632. In some embodiments, the network interface 830 may also communicate with the integrated circuit 610 and other integrated circuits (not shown). For example, in some embodiments, the network interface 630 is a card such as a peripheral component interconnect (PCI) card that communicates with other integrated circuits on a system board. The network interface 630 may be any type of network interface that allows the system 600 to communicate on a network. For example, network interface 630 may allow connection to a wireless network, a wired network, or the like.

FIG. 8 shows an electronic system 700 including a processor 710, memories 720 and 730, and a network interface 630. The processor 710 may includes port circuits 712 and 714, the memory 720 may include port circuits 722 and 724, and the memory 730 may include port circuits 732 and 734. One or more of the port circuits shown in FIG. 8 may include components to perform filtering and waveform capturing similar as discussed above, such as the components shown and discussed above with respect to FIG. 4.

The processor 710, the memory 720, and the memory 730 may be configured in a ring such that each device communicates with two others using at least one port circuit. For example, the processor 710 may communicate with the memory 720 using the port circuit 714 coupled to a signal node 702, and also communicate with the memory 730 using the port circuit 712 coupled to the signal node 706. Also for example, the memory device 720 communicates with the memory device 730 using the port circuit 722 coupled to signal node 704.

In some embodiments, the processor 710 is part of one integrated circuit die, the memory device 720 is part of a second integrated circuit die, and the memory device 730 is part of a third integrated circuit die. In these embodiments, each of the integrated circuit dice may be separately packaged and mounted on a common circuit board. Each of the integrated circuits may also be separately packaged and mounted on separate circuit boards interconnected by the signal nodes. In other embodiments, the processor 710 and the memory devices 720 and 730 are separate integrated circuit dice packaged together, such as in a multi-chip module.

Systems represented by the various foregoing figures can be of any type. Examples of represented systems include computers (e.g., desktops, laptops, handhelds, servers, tablets, web appliances, routers, etc.), wireless communications devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 3) players, video games, watches, etc.), and the like.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments. Furthermore, for ease of understanding, certain method procedures may have been delineated as separate procedures; however, these separately delineated procedures should not be construed as necessarily order dependent in their performance. That is, some procedures may be able to be performed in an alternative ordering, simultaneously, etc.

Although embodiments of the present invention have been described with reference to a number of illustrative embodiments thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

What is claimed is:

1. An integrated circuit comprising:
a first port to receive a first signal from a first channel;
a first device, coupled to the first port, to modify a channel response of the first signal received from the first channel, the first device including a filtering device having a plurality of stages, each stage including one of a plurality of voltage-to-current converters and one of a plurality of current multipliers, the filtering device to provide a separate output for each of the stages; and a waveform capture device, coupled to the first device, to capture a waveform of a signal modified by the first device.

2. The integrated circuit of claim 1, wherein the first device further includes a sampling circuit.

3. The integrated circuit of claim 2, wherein the filtering device filters the first signal from the first channel prior to the sampling circuit.

4. The integrated circuit of claim 2, wherein the sampling circuit samples the first signal from the first channel prior to the filtering device.

5. The integrated circuit of claim 1, further comprising:
a second port to receive a second signal from a second channel;
a second device, coupled to the second port, to modify a channel response of the second signal received from the second channel; and
another waveform capture device, coupled to the second device, to capture a waveform of a signal modified by the second device.

6. The integrated circuit of claim 5, wherein the second device comprises a filtering device that includes a plurality of voltage-to-current converters and a plurality of current multipliers coupled in a plurality of stages.

7. The integrated circuit of claim 1, wherein the filtering device further includes a plurality of sampling circuits to sample the signal received at the first port.

8. The integrated circuit of claim 1, wherein the waveform capture device includes a variable offset to skew a reference current.

9. The integrated circuit of claim 1, wherein the first signal comprises a differential signal.

10. A chip comprising:
a processing circuit to receive a signal across a channel and perform signal processing on the signal, the processing circuit including a filtering circuit having a plurality of stages to provide a plurality of outputs, each of the stages to provide a separate response as an output of a filtering operation, the processing circuit to output a processed signal based on the separate responses, the filtering circuit including a plurality of voltage-to-current converters and a plurality of current multipliers; and
a waveform capturing device to capture a waveform of the signal based on the processed signal.

11. The chip of claim 10, wherein the processing circuit further includes a sampling circuit.

12. The chip of claim 11, wherein the filtering circuit filters the signal from the channel prior to the sampling circuit.

13. The chip of claim 11, wherein the sampling circuit samples the signal from the channel prior to the filtering circuit.

14. The chip of claim 10, wherein the processing circuit modifies a channel response of the received signal.

15. The chip of claim 10, wherein the filtering circuit further includes a plurality of sampling circuits to sample the received signal.

16. The chip of claim 10, wherein the waveform capturing device includes a variable offset to skew a reference current.

17. The chip of claim 10, wherein each stage includes a voltage-to-current converter and a current multiplier.

18. A method comprising:
receiving a signal from a channel;
modifying a channel response of the received signal by performing a filtering operation on the received signal, the filtering operation including dividing the received signal into a plurality of stages and providing a plurality of outputs, each stage providing a separate response as an output of the filtering operation, and each stage including a separate voltage-to-current conversion and a separate current multiplication;
capturing a waveform of a signal having the modified channel response; and
displaying the captured waveform.

19. The method of claim 18, wherein modifying the channel response includes a sampling operation of the received signal.

20. The method of claim 19, wherein the filtering operation occurs prior to the sampling operation of the received signal.

21. The method of claim 19, wherein the sampling operation of the received signal occurs prior to the filtering operation.

22. The method of claim 18, wherein each of the stages includes a voltage-to-current converter to perform the voltage-to-current conversion and a separate current multiplier to perform the current multiplication.

23. The method of claim 18, wherein the filtering operation further includes combining filtered responses.

24. The method of claim 23, wherein capturing the waveform includes sampling the combined filtered responses.

25. The method of claim 18, wherein capturing the waveform includes skewing a reference current.

26. The method of claim 18, further comprising:
receiving another signal across another channel;
modifying a channel response of the received another channel; and
capturing a waveform of a signal having the modified channel response.

27. The method of claim 18, wherein each stage includes a separate one of a plurality of voltage-to-current converters and a separate one of a plurality of current multipliers.

28. An electronic system comprising:
an integrated circuit including a port to receive a signal from a channel, a processing device, coupled to the port, to modify a channel response of the signal received from the channel, and a waveform device, coupled to the processing device, to capture a waveform of a signal modified by the processing device, the processing device including a filtering device having a plurality of voltage-to-current converters and a plurality of current multipliers coupled in a plurality of stages; and
a network interface to couple the integrated circuit to a network.

29. The electronic system of claim 28, wherein the processing device further includes a sampling circuit.

30. The electronic system of claim 29, wherein the filtering device filters the received signal from the channel prior to the sampling circuit.

31. The electronic system of claim 29, wherein the sampling circuit samples the received signal from the channel prior to the filtering circuit.

* * * * *